United States Patent
Uehara et al.

(10) Patent No.: US 8,542,067 B2
(45) Date of Patent: Sep. 24, 2013

(54) OSCILLATION CIRCUIT AND IMAGE DISPLAY DEVICE

(75) Inventors: Satoru Uehara, Kobe (JP); Keiji Furukawa, Kobe (JP)

(73) Assignee: Fujitsu Ten Limited, Kobe-Shi (JP)

( * ) Notice: Subject to any disclaimer, the term of this patent is extended or adjusted under 35 U.S.C. 154(b) by 374 days.

(21) Appl. No.: 13/121,050

(22) PCT Filed: Sep. 29, 2009

(86) PCT No.: PCT/JP2009/066979
§ 371 (c)(1),
(2), (4) Date: Mar. 25, 2011

(87) PCT Pub. No.: WO2010/035876
PCT Pub. Date: Apr. 1, 2010

(65) Prior Publication Data
US 2011/0175866 A1  Jul. 21, 2011

(30) Foreign Application Priority Data
Sep. 29, 2008 (JP) .................... 2008-250465

(51) Int. Cl.
*G09G 5/00* (2006.01)
*H03L 7/085* (2006.01)

(52) U.S. Cl.
USPC ............ 331/1 A; 327/159; 345/204; 345/213; 345/88; 345/691

(58) Field of Classification Search
USPC ................. 327/159; 331/1 A; 345/204, 213, 345/88, 691
See application file for complete search history.

(56) References Cited

U.S. PATENT DOCUMENTS 7,212,193 B2 * 5/2007 Ueda .............................. 345/204
7,683,898 B2 * 3/2010 Park et al. ..................... 345/204

FOREIGN PATENT DOCUMENTS

| JP | A-05-160721 | 6/1993 |
| JP | A-06-282349 | 10/1994 |
| JP | A-10-173518 | 6/1998 |
| JP | A-11-055555 | 2/1999 |
| JP | A-2001-308697 | 11/2001 |
| JP | A-2003-069854 | 3/2003 |
| JP | A-2006-270438 | 10/2006 |
| JP | A-2007-248103 | 9/2007 |

OTHER PUBLICATIONS

International Search Report in International Application No. PCT/JP2009/066979; dated Dec. 1, 2009 (with English-language translation).
Jul. 20, 2011 Office Action issued in Chinese Patent Application No. 200910171421.X (with translation).

* cited by examiner

*Primary Examiner* — Arnold Kinkead
(74) *Attorney, Agent, or Firm* — Oliff & Berridge, PLC

(57) ABSTRACT

Disclosed is an oscillation circuit. The oscillation circuit supplies predetermined oscillation signals to a generating circuit having a divider, a phase comparator, and a generator. A clock signal generating section generates clock signals in a cycle based on the comparison results from the phase comparator. A clock signal mask section masks a part of the clock signals generated by the clock signal generating section to generate the predetermined oscillation signals and supplies the predetermined oscillation signals to the divider. The clock signal mask section masks a part of the clock signals such that the cycle of sampling signals generated by the generator is the same as a predetermined cycle which is the cycle of a clock for use in generating image signals.

9 Claims, 7 Drawing Sheets

OSCILLATION CIRCUIT AND IMAGE DISPLAY DEVICE

TECHNICAL FIELD

The present invention relates to an oscillation circuit and an image display device.

BACKGROUND ART

Image signals are subjected to various kinds of processing in accordance with the specification of an apparatus which performs image display or the like. For example, in displaying analog images, image signals are sampled with a sampling clock having the same cycle as the clock of the input image signals. FIG. 7 is a configuration diagram of a circuit for displaying images. As shown in FIG. 7, a TFT (Thin Film Transistor) liquid crystal display 105 displays image signals from an image output circuit section 102 which generates and outputs various images, such as navigation images. The TFT liquid crystal display 105 samples image signals on the basis of a sampling clock from a display timing circuit section 103 and performs drawing processing. The display timing circuit section 103 generates the sampling clock in synchronization with a horizontal synchronization signal from the image output circuit section 102 on the basis of signals oscillated by an oscillation circuit section 106.

FIGS. 8 and 9 are timing charts showing the relationship between the clock of the input image signals and the sampling clock. As shown in FIG. 8, when the clock of the input image signals coincides with the sampling clock, in the TFT liquid crystal display 105, the image signals are correctly sampled, such that the images are appropriately displayed. Meanwhile, as shown in FIG. 9, when the clock of the input image signals does not coincide with the sampling clock, in the TFT liquid crystal display 105, the image signals are not correctly sampled, such that the images are inappropriately displayed. In this case, blotting or profile blurring occurs in the displayed characters.

PTL 1 describes an image display device which changes the division ratio of a divider in a PLL (Phase-Locked Loop) circuit. PTL 2 describes a clock generating circuit which partially masks a sampling clock to carry out frequency conversion with a simple configuration.

CITATION LIST

Patent Literature

PTL 1: JP-A-10-173518
PTL 2: JP-A-2006-270438

SUMMARY OF INVENTION

Technical Problem

In many cases, an electronic apparatus which handles image signals processes the image signals by means of a commonly distributed (commercial) IC chip so as to suppress development costs or the like. That is, in many cases, a commonly distributed IC chip is used as a display timing circuit section. At this time, there is a case where the clock of the input image signals does not coincide with a sampling clock which is generated by the commonly distributed IC chip. According to the technique of PTL 1, the division ratio of a divider in a circuit for generating the sampling clock is changed, such that the clock of the image signals can coincide with the sampling clock. In this case, however, it is very costly to change the division of the divider. According to the technique of PTL 2, the sampling clock is partially masked without changing the division ratio of the divider, such that the number of sampling clocks can match with the number of clocks of the image signals in one cycle of the horizontal synchronization signal. However, in this case, blotting or profile blurring occurs in the characters due to a fine variance between the cycle of the clock of the image signals and the cycle of the sampling clock.

The invention has been finalized in consideration of the above-described problems, and an object of the invention is to provide an oscillation circuit and an image display device capable of preventing blotting or profile blurring in characters without changing the division ratio of a divider.

Solution to Problem

According to the invention, in order to achieve the above-described object, a part of clock signals supplied to a divider are masked.

Specifically, the invention provides an oscillation circuit which supplies predetermined oscillation signals to a generating circuit. The generating circuit includes a divider which has a fixed division ratio, and divides the predetermined oscillation signals with the division ratio and outputs divided signals, a phase comparator which compares a phase difference between the phase of a synchronization signal included in image signals and the phase of the divided signals output from the divider, and a generator which generates sampling signals in a cycle based on the comparison results from the phase comparator. The oscillation circuit includes a clock signal generating section which generates clock signals in the cycle based on the comparison results from the phase comparator, and a clock signal mask section which masks a part of the clock signals generated by the clock signal generating section to generate the predetermined oscillation signals and supplies the predetermined oscillation signals to the divider. The clock signal mask section masks a part of the clock signals such that the cycle of the sampling signals generated by the generator is the same as a predetermined cycle which is the cycle of a clock for use in generating the image signals.

The oscillation circuit is connectable to the generating circuit to adjust the cycle of the sampling signals output from the generating circuit. As described above, the generating circuit has the divider, the phase comparator, and the generator, and the generator generates the sampling signals in the cycle based on the comparison results from the phase comparator. The divider of the generating circuit has a fixed division ratio, and if an oscillation signal is input, divides the oscillation signal with the division ratio and sends the divided signal to the phase comparator. According to the invention, the oscillation signals input to the divider are called the predetermined oscillation signals. The phase comparator of the generating circuit compares the phase of the synchronization signal input from the outside with the phase from the divider. The synchronization signal is a signal for establishing synchronization with the image signals. For example, a horizontal synchronization signal or a vertical synchronization signal may be used. The oscillation circuit is configured to adjust the cycle of the sampling signals generated by the generator of the generating circuit. The oscillation circuit may be embodied as a circuit which is connected to the generating circuit to adjust the cycle of the sampling signals output from the generating circuit, thereby controlling the operation of the generating circuit.

The clock signal generating section in the oscillation circuit generates the clock signals in the cycle based on the comparison results from the phase comparator of the generating circuit. For example, a voltage-controlled oscillator may be applied which can adjust the cycle of the clock in accordance with a voltage output from the phase comparator of the generating circuit.

The clock signal mask section in the oscillation circuit sends the clock signal generated by the clock signal generating section to the divider of the generating circuit, but is configured to mask a part of the clock signals. The masking of a part of the clock signals means that the divider cannot recognize some clocks of the clock signals with multiple continuous clocks generated by the clock signal generating section and, for example, refers to superimposing different signals on a part of the clock signals to eliminate the clocks.

On the other hand, in the generator of the generating circuit, the sampling signals in the cycle based on the comparison results of the phase comparator are generated, and in adjusting the signals in a predetermined cycle, it is necessary to adjust the signals sent to the phase comparator. Here, the predetermined cycle is the cycle of the clock used in generating the image signals and is, for example, the cycle which is determined on the basis of the specification of the number of pixels of a circuit for generating the image signals, or the like. The oscillation circuit masks only a part of the clock signals to the phase comparator such that the cycle of the sampling signals output from the generator coincides with the predetermined cycle. A part of the clock signals sent to the phase comparator are masked, such that the phase comparator erroneously perceives that the cycle of the sampling signals output from the generator is delayed and changes the output. Thus, the cycle of the sampling clock output from the generator consequently becomes faster. Therefore, the oscillation circuit can adjust the sampling clock generated by the generating circuit in a desired cycle without changing the division ratio of the divider in the generating circuit. According to the invention, with the addition of a small circuit, it becomes possible to eliminate a variance between the cycle of the clock of the image signals and the cycle of the sampling clock while effectively utilizing the existing generating circuit.

The clock signal mask section is configured to mask a predetermined number of clocks of the clock signal, and the predetermined number of clocks may be determined on the basis of the predetermined cycle and the division ratio of the divider. The sampling clock generated by the generator is determined by the division ratio of the divider and the number of clocks to be masked by the clock signal mask section. For this reason, in setting the cycle of the sampling clock to the predetermined cycle, the number of clocks to be masked can be determined from the relationship between the predetermined cycle and the division ratio. Therefore, it is possible to adjust the sampling clock generated by the generating circuit in a desired cycle.

The generator may output a synchronization signal synchronized with the sampling signal to the clock signal mask section, and the clock signal mask section may mask a part of the clock signals on the basis of the synchronization signal output from the generator. With the oscillation circuit configured as above, it is possible to stably generate the sampling clock which is synchronized with the synchronization signal. The clock signal mask section may start to mask the clock signals immediately after the synchronization signal output from the generator is input, or may start to mask the clock signals when a predetermined time has elapsed after the synchronization signal output from the generator has been received.

The clock signal mask section may start to mask the clock signals when a predetermined time has elapsed after the generator has started to generate the sampling signals. With the oscillation circuit configured as above, the mask processing does not start until a predetermined time elapses, rapidly stabilizing the operation of the generating circuit. The oscillation circuit may further have a switch which supplies the clock signals generated by the clock signal generating section directly to the divider while bypassing the clock signal mask section for a predetermined time after the generator has started to generate the sampling signals or may further have a switch which cuts the synchronization signal output from the generator for a predetermined time after the generator has started to generate the sampling signals.

The invention also provides an image display device which receives image signals and displays images. The image display device includes an image display circuit which samples the image signals with sampling signals to display the images, a generating circuit which generates the sampling signals supplied to the image display circuit, and an oscillation circuit which supplies predetermined oscillation signals to the generating circuit. The generating circuit has a divider which has a fixed division ratio, and divides the predetermined oscillation signals with the division ratio and outputs divided signals, a phase comparator which compares a phase difference between the phase of a synchronization signal in the image signals and the phase of the divided signals output from the divider, and a generator which generates the sampling signals in a cycle based on the comparison results from the phase comparator. The oscillation circuit has a clock signal generating section which generates clock signals in a cycle based on the comparison results from the phase comparator, and a clock signal mask section which masks a part of the clock signals generated by the clock signal generating section to generate the predetermined oscillation signals and supplies the predetermined oscillation signals to the divider. The clock signal mask section masks a part of the clock signals such that the cycle of the sampling signals generated by the generator is the same as a predetermined cycle for use in generating the image signals.

Advantageous Effects of Invention

It becomes possible to provide an oscillation circuit and an image display device capable of preventing blotting or profile blurring in characters without changing the division ratio of the divider.

DESCRIPTION OF EMBODIMENTS

Hereinafter, the best mode for carrying out the invention will be described. The following embodiment is just for illustration, and the invention is not limited thereto.

Figure 1:
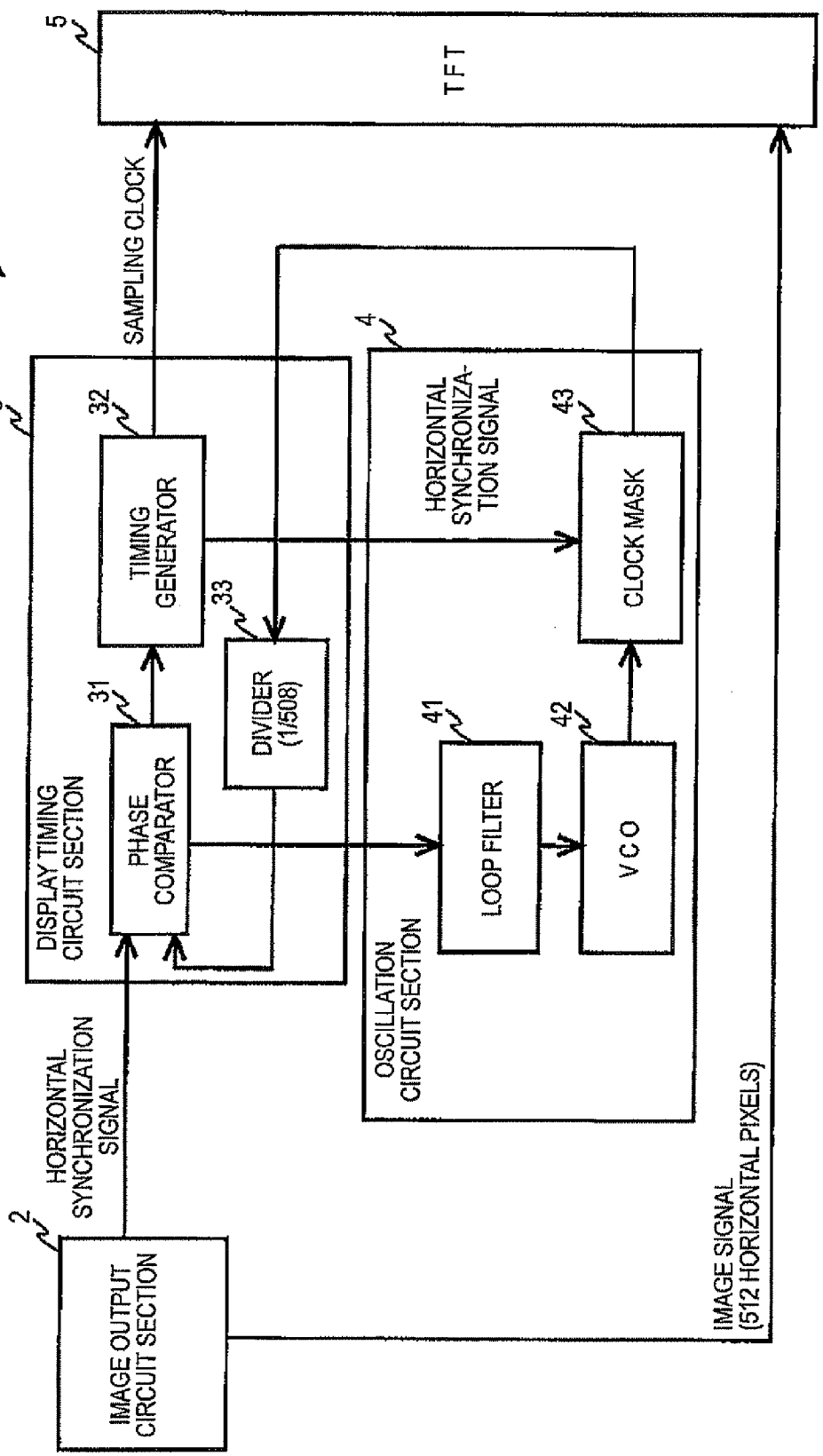
FIG. 1 is a configuration diagram of an image display device.

FIG. 1 is a configuration diagram of an image display device 1 to which the invention is applied. As shown in FIG. 1, the image display device 1 includes an image output circuit section 2, a display timing circuit section 3 (an example of a generating circuit), an oscillation circuit section 4, and a TFT (Thin Film Transistor) liquid crystal display 5 (an example of an image display circuit). The image output circuit section 2 generates and outputs image signals, such as a car navigation screen or an operation screen on which various AV (Audio/Visual) instruments are operated. The image output circuit section 2 is a circuit section which generates image signals by executing a computer program. The image output circuit section 2 separately outputs a composite synchronization signal, including a horizontal synchronization signal and a vertical synchronization signal, and the image signals so as to suppress attenuation of various signals. Although in this embodiment, description will be provided focusing on the operation when the horizontal synchronization signal from the composite synchronization signal is particularly used, the invention can be applied to a case where the vertical synchronization signal is used. The image signals output from the image output circuit section 2 are sent to the TFT liquid crystal display 5. The horizontal synchronization signal output from the image output circuit section 2 is sent to the display timing circuit section 3.

The image signals output from the image output circuit section 2 are signals with 512 horizontal pixels, and the cycle of the horizontal synchronization signal or the cycle (an example of a predetermined cycle) of a clock in generating the image signals is based on the image signals. The image signals output from the image output circuit section 2 are image signals in which three primary color signals of red, green, and blue constitute one pixel. Thus, in scanning one horizontal line of the image signals, practically, sampling signals with 512×3=1536 clocks are required. In the following description, for convenience of description, it is assumed that a clock which is required for sampling one pixel constituted by three primary color signals is referred to as one clock. That is, description will be provided assuming that, in order to scan one horizontal line of the image signal with 512 horizontal pixels, sampling signals with 512 clocks are required.

The display timing circuit section 3 is a commonly distributed (commercial) semiconductor device for image signal processing. As shown in FIG. 1, the display timing circuit section 3 includes a phase comparator 31, a timing generator 32 (an example of a generator), and a divider 33. The display timing circuit section 3 has a specification assuming that image signals with 508 horizontal pixels are processed. Thus, the division ratio of the divider 33 is set to 1/508. The divider 33 divides input oscillation signals with the division ratio (1/508) set in advance and outputs divided signals. That is, each time the oscillation signal with 508 clocks is input, the divided signal with one clock is output. The phase comparator 31 compares the phases of two input signals and outputs the signal of a voltage based on the phase difference. To the phase comparator 31 are input the horizontal synchronization signal from the image output circuit section 2 and the divided signal from the divider 33. The output of the phase comparator 31 is sent to the timing generator 32 and a loop filter 41 of the oscillation circuit section 4 described below. That is, the phase comparator 31 compares the phase of the horizontal synchronization signal from the image output circuit section 2 with the phase of the divided signal from the divider 33, and sends the signal of a voltage based on the phase difference to the timing generator 32 and the loop filter 41. The timing generator 32 generates and outputs various signals in accordance with the voltage of the signal output from the phase comparator 31. That is, as shown in FIG. 1, for example, the timing generator 32 generates the sampling clock which is used when the TFT liquid crystal display 5 samples the image signals from the image output circuit section 2 and outputs the sampling clock to the TFT liquid crystal display 5. The timing generator 32 also generates the horizontal synchronization signal which is used when a clock mask 43 of the oscillation circuit section 4 described below adjusts the timing of masking the clock signals and outputs the horizontal synchronization signal to the clock mask 43.

Figure 2:
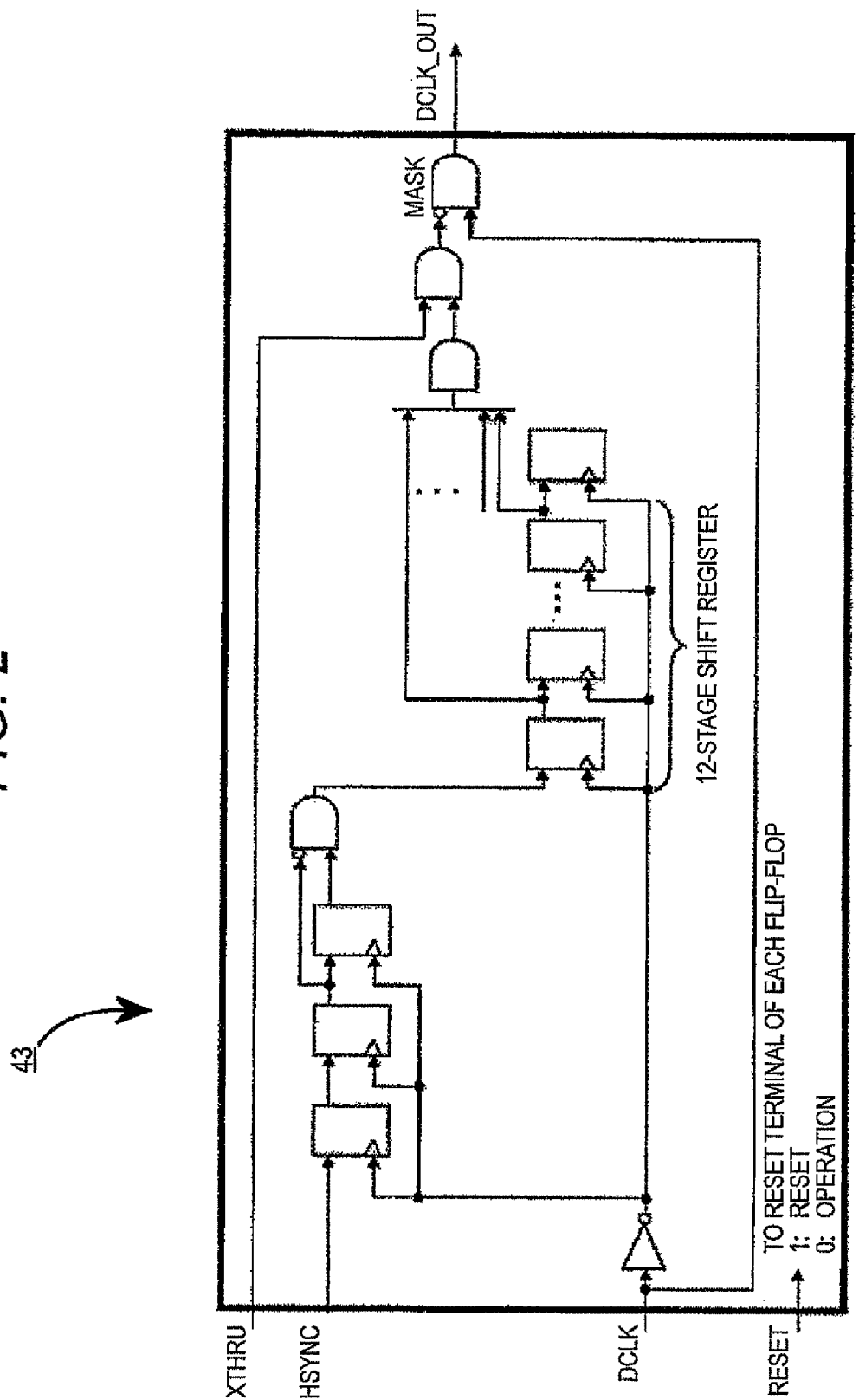
FIG. 2 is a configuration diagram of a clock mask.
Figure 3:
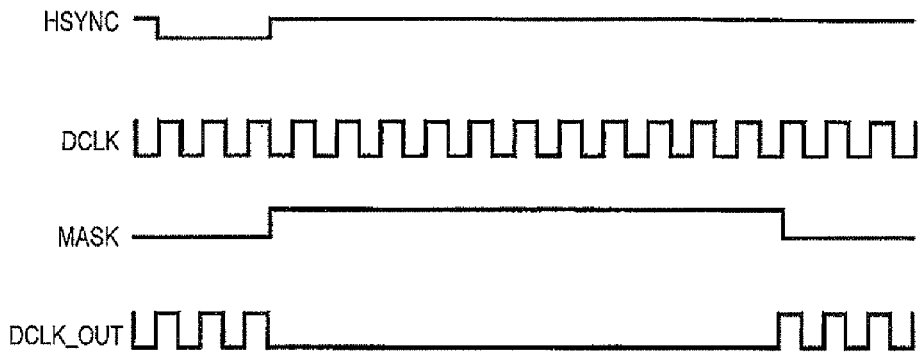
FIG. 3 is a timing chart.

As shown in FIG. 1, the oscillation circuit section 4 includes a loop filter 41, a VCO (Voltage Controlled Oscillator) 42 (an example of a clock signal generating section), and a clock mask 43 (an example of a clock signal mask section). The loop filter 41 is a low-pass filter which removes the high-frequency component of the signal output from the phase comparator 31. The signal with the high-frequency component removed by the loop filter 41 is output to the VCO 42. The VCO 42 is a circuit which generates the clock signals with a frequency based on the input voltage. In other words, the VCO 42 is a voltage-controlled oscillator which can adjust the oscillation frequency of the clock signals in accordance with the input voltage. The VCO 42 generates the clock signals with a frequency based on the voltage of the signal output from the loop filter 41 and outputs the clock signals to the clock mask 43. The clock mask 43 is a circuit which can mask the clock signals output from the VCO 42 in accordance with the horizontal synchronization signal output from the timing generator 32. FIG. 2 shows the configuration of the clock mask 43. As shown in FIG. 2, the clock mask 43 is provided with a four-stage shift register which can mask the clock signals from the VCO 42 by four clocks (an example of a predetermined number of clocks). The image signals which are handled in this embodiment are color signals. Thus, practically, a 12-stage shift register is provided to mask the clock signals from the VCO 42 by 12 clocks. FIG. 2 shows the clock mask 43 in which a 12-stage shift register is provided. The clock mask 43 has a MASK which masks the clock signals, a RESET terminal to which a reset signal is input, a DCLK terminal to which the clock signals are input from the VCO 42, an HSYNC terminal to which the horizontal synchronization signal is input from the timing generator 32, and a DCLK_OUT terminal from which the masked clock signals are output. The clock mask 43 also has an XTHRU terminal which outputs the input clock signals unmasked. Usually, the XTHRU terminal is not used. After the reset signal is input to the RESET terminal, if four clocks are input from the VCO 42 to the DCLK terminal, the AND condition is established for all the stages of the shift register, and the clock signals from the VCO 42 after the fifth clock pass through the clock mask 43 and are output from the DCLK_OUT terminal. FIG. 3 is a timing chart of an operation when the clock mask 43 masks the clock signals. As shown in FIG. 3, if the horizontal synchronization signal is received from the timing generator 32, the clock mask 43 masks the clock signals from the VCO 42 by four clocks and outputs the clock signals after the fifth clock (an example of predetermined oscillation signals) to the divider 33. The image signals which are handled in this embodiment are color signals. Thus, practically, the clock signals from the VCO 42 are masked by 12 clocks, and the clock signals after the 13th clock are output to the divider. FIG. 3 is a timing chart when the clock signals from the VCO 42 are masked by 12 clocks.

The TFT liquid crystal display 5 is a liquid crystal display using a thin-film transistor. The TFT liquid crystal display 5 samples the image signals from the image output circuit section 2 on the basis of the sampling clock sent from the display timing circuit section 3 or various other timing signals and performs drawing processing on a liquid crystal panel. That is, the sampling clock output from the timing generator 32 and the image signals output from the image output circuit section 2 are input to the TFT liquid crystal display 5. The TFT liquid crystal display 5 displays images on the basis of the input sampling clock and the image signals.

In the image display device 1 configured as above, if power is supplied and the image signals are output from the image output circuit section 2 or the horizontal synchronization signal is output, even when the division ratio of the divider 33 of the display timing circuit section 3 is 1/508, a sampling clock in a cycle corresponding to the image signals with 512 horizontal pixels is generated. Hereinafter, the operation of the image display device 1 of this embodiment will be described. In the following description, it is assumed that one cycle of the horizontal synchronization signal corresponding to the image signals with 508 horizontal pixels is T0 and one cycle of the horizontal synchronization signal corresponding to the image signals with 512 horizontal pixels is T1.

As described above, the display timing circuit section 3 for use in the image display device 1 of this embodiment is a commonly distributed semiconductor device for image signal processing and is designed assuming that the image signals with 508 horizontal pixels are processed. That is, the division ratio of the divider 33 is fixed to 1/508. The phase comparator 31 is designed to output a predetermined voltage V0 if the horizontal synchronization signal (1 clk/T0) corresponding to the image signals with 508 horizontal pixels is input from the image output circuit section 2 and the divided signal (1 clk/T0) with one clock is input from the divider 33 in the cycle T0. The timing generator 32 is designed to generate the horizontal synchronization signal (1 clk/T0) corresponding to the image signals with 508 horizontal pixels and the sampling clock (508 clk/T0) in the cycle corresponding to the image signals with 508 horizontal pixels on the basis of the predetermined voltage V0.

First, it is assumed that the VCO 42 of the oscillation circuit section 4 generates the clock signals (508 clk/T0) with 508 clocks and outputs the clock signals to the clock mask 43 in the cycle T0. The clock mask 43 masks the clock signals from the VCO 42 by four clocks in synchronization with the horizontal synchronization signal (1 clk/T0) from the timing generator 32 and outputs the clock signals (504 clk/T0) with 504 clocks in the cycle T0. Thus, in the cycle T0, only the oscillation signals with 504 clocks are input to the divider 33, and in the cycle T1 longer than the cycle T0, and the oscillation signals with 508 clocks are input to the divider 33. For this reason, the divider 33 outputs the divided signals (1 clk/T1) with one clock to the phase comparator 31 in the cycle T1. That is, to the phase comparator 31 are input the horizontal synchronization signal (1 ckl/T1) corresponding to the image signals with 512 horizontal pixels is input from the image output circuit section 2 and the divided signals (1 clk/T1) with one clock from the divider 33 in the cycle T1. In this case, the phase comparator 31 outputs a voltage V1 higher than the predetermined voltage V0 to the loop filter 41 and the timing generator 32. When this happens, the VCO 42 generates the clock signals (512 clk/V1) with 512 clocks in the cycle T1 in accordance with the voltage V1 input through the loop filter 41 and outputs the clock signals to the clock mask 43. Meanwhile, the timing generator 32 generates the sampling clock (512 clk/T1) with 512 clocks in the cycle T1, that is, the sampling clock in the cycle corresponding to the image signal with 512 horizontal pixels on the basis of the input voltage V1 and outputs the sampling clock to the TFT liquid crystal display 5. The timing generator 32 generates the horizontal synchronization signal (1 clk/T1) with one clock in the cycle T1, that is, the horizontal synchronization signal in the cycle corresponding to the image signals with 512 horizontal pixels on the basis of the input voltage V1 and outputs the horizontal synchronization signal to the clock mask 43.

Next, the clock mask 43 masks the clock signals (512 elk/V1) from the VCO 42 by four clocks in synchronization with the horizontal synchronization signal (1 clk/T1) from the timing generator 32 and outputs the clock signals (508 clk/T1) with 508 clocks in the cycle T1. Thus, in the cycle T1, the oscillation signals with 508 clocks are input to the divider 33. For this reason, the divider 33 outputs the divided signals (1 clk/T1) with one clock in the cycle T1 to the phase comparator 31. The phase comparator compares the horizontal synchronization signal (1 clk/T1) input from the image output circuit section 2 with the divided signals (1 clk/T1) input from the divider 33 and outputs the voltage V1 to the loop filter 41 and the timing generator 32. The timing generator 32 generates the sampling clock in the cycle corresponding to the image signals with 512 horizontal pixels on the basis of the input voltage V1 and outputs the sampling clock to the TFT liquid crystal display 5.

In this way, the oscillation circuit section 4 is incorporated into the image display device 1, such that the sampling clock in the cycle corresponding to the image signals with 512 horizontal pixels can be stably generated, regardless of the use of the display timing circuit section 3 which is designed assuming that the image signals with 508 horizontal pixels are processed.

The display timing circuit section 3 and the oscillation circuit section 4 of this embodiment constitute a loop circuit. In the above description, in the first loop, the frequency of the sampling clock is appropriately adjusted, and in the second loop, the frequency of the sampling clock is stabilized. Practically, multiple loops are repeated, such that the frequency of the sampling clock is gradually transformed and stabilized.

According to this embodiment, with the addition of a small circuit, such as the above-described oscillation circuit section 4, while the existing circuit, such as the above-described display timing circuit section 3, can be effectively utilized, the variance between the cycle of the clock of the image signals and the cycle of the sampling clock can be eliminated. When the above-described oscillation circuit section 4 is connected to the display timing circuit section 3, in order to adjust the level of the signals transferred between both circuits or the bias voltage, an interface circuit or the like may be provided to arbitrarily set the level of the signals or the bias voltage. Therefore, the oscillation circuit section 4 can be applied widely.

Figure 4:
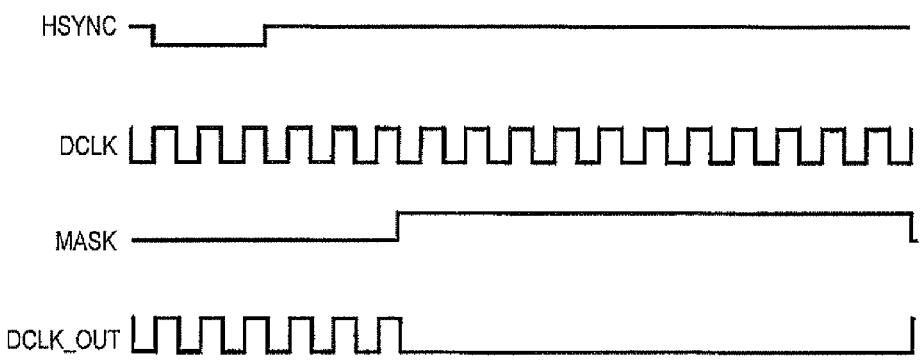
FIG. 4 is a timing chart according to a modification.

In the above-described embodiment, if the horizontal synchronization signal from the timing generator 32 is received, the clock mask 43 directly masks the clock signals from the VCO 42. Meanwhile, the clock mask 43 may mask the clock signals in a short time after the horizontal synchronization signal from the timing generator 32 has been received. FIG. 4 is a timing chart of this case. As shown in FIG. 4, the clock signals are masked in a short time after the horizontal synchronization signal has been received, adjusting the timing at which the sampling clock is generated. For example, it is possible to adjust the display position of the images displayed on the TFT liquid crystal display 5, the delay time of signal processing in the image processing circuit, or the like.

Figure 5:
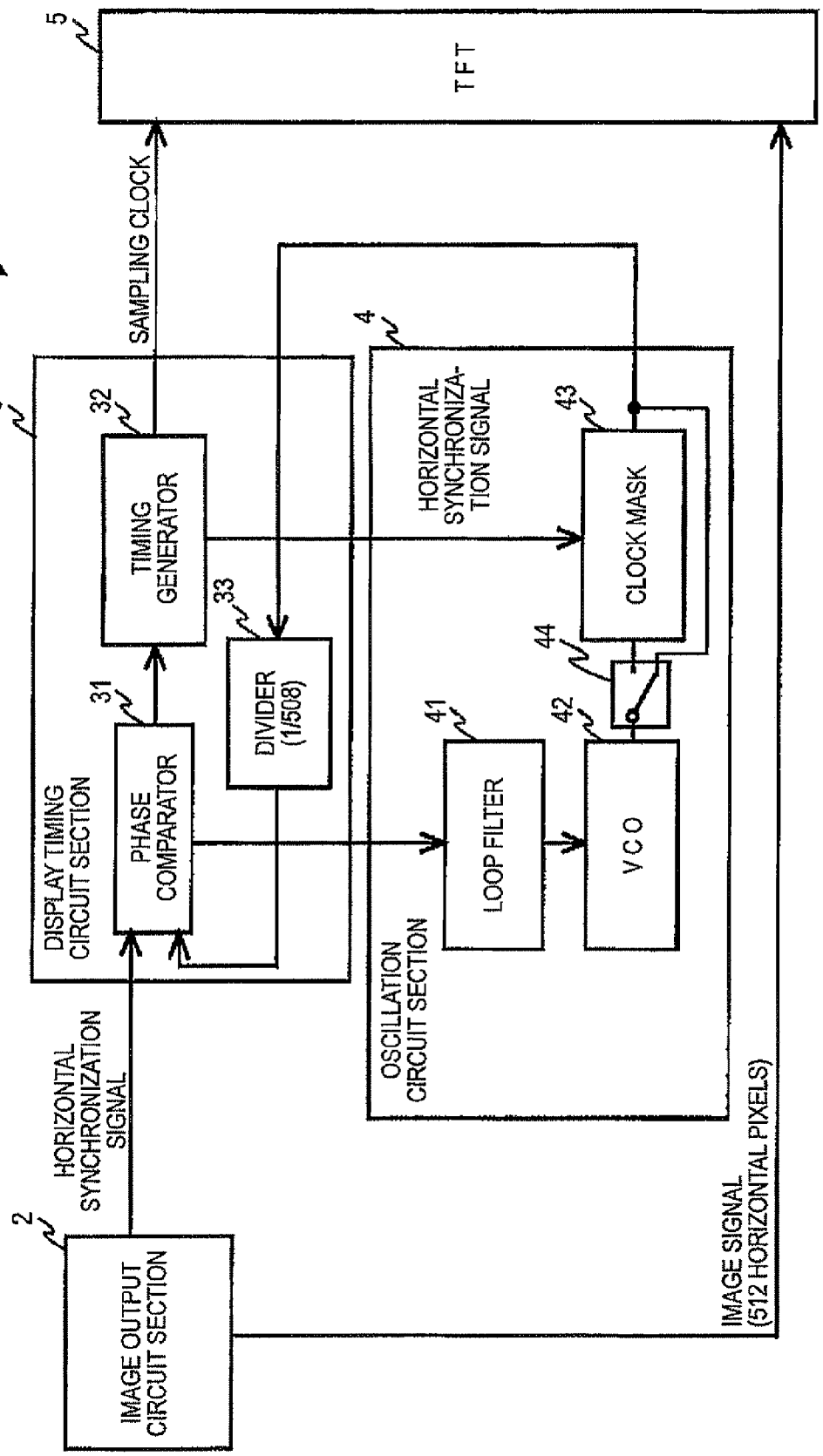
FIG. 5 is a configuration diagram of an image display device according to a modification.
Figure 6:
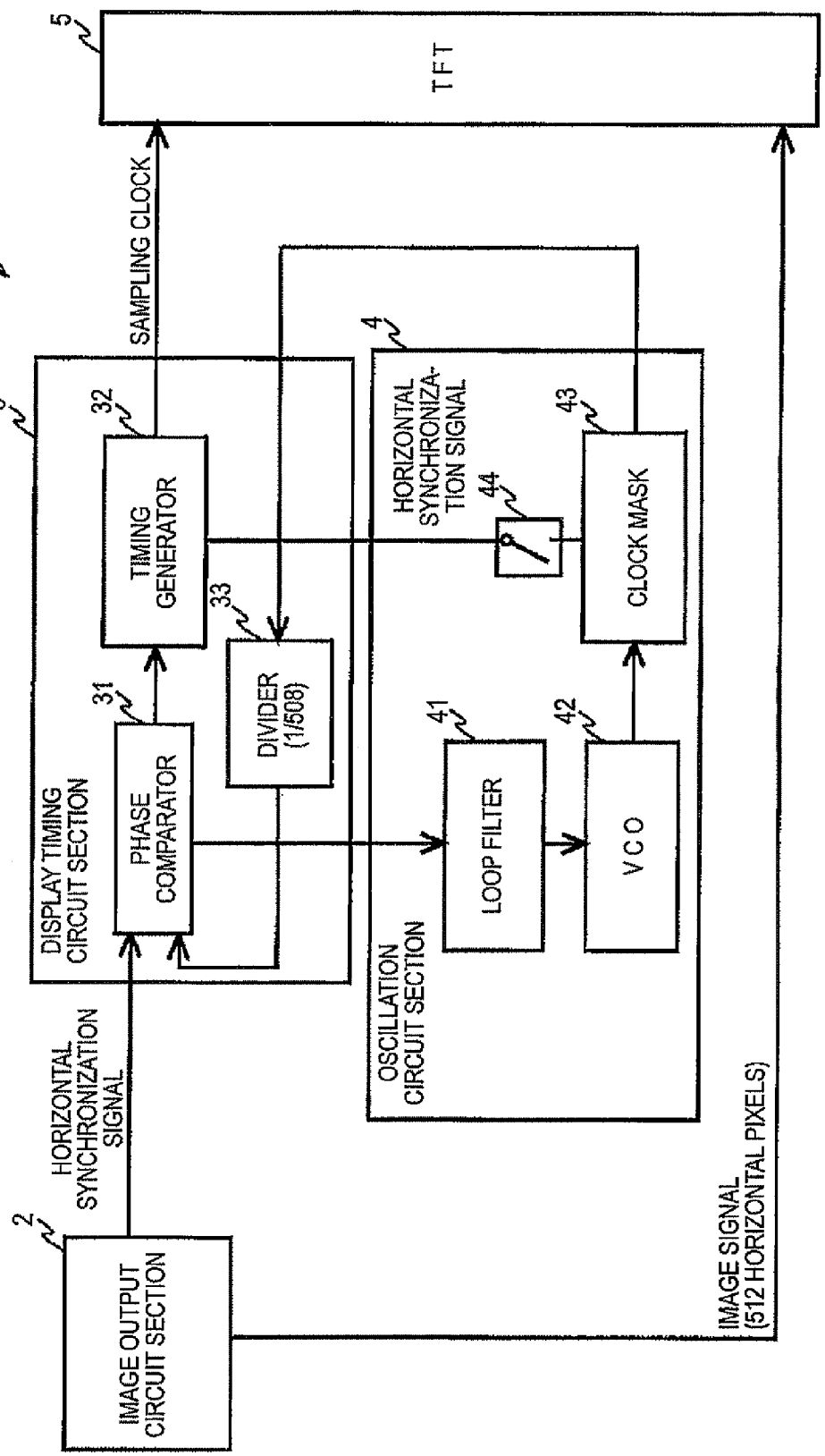
FIG. 6 is a configuration diagram of an image display device according to a modification.
Figure 7:
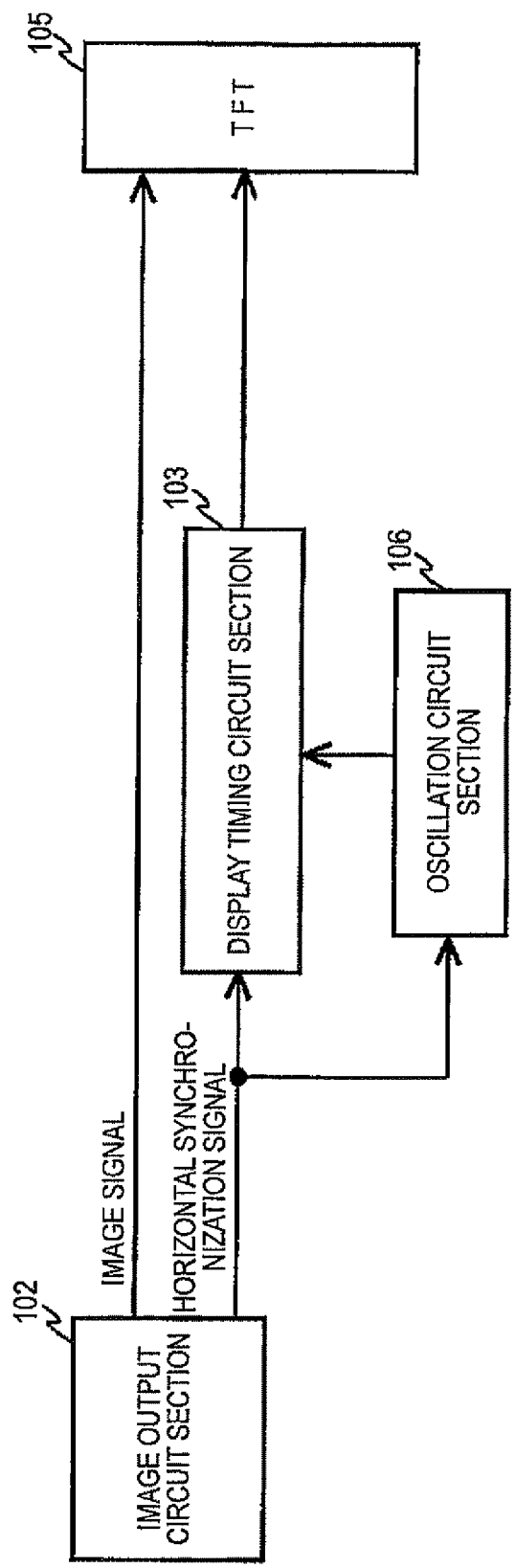
FIG. 7 is a configuration diagram of an image display device according to the related art.
Figure 8:
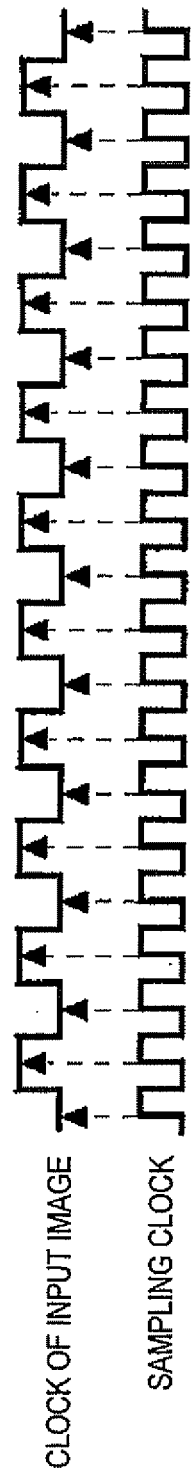
FIG. 8 is a timing chart when clocks coincide with each other.
Figure 9:
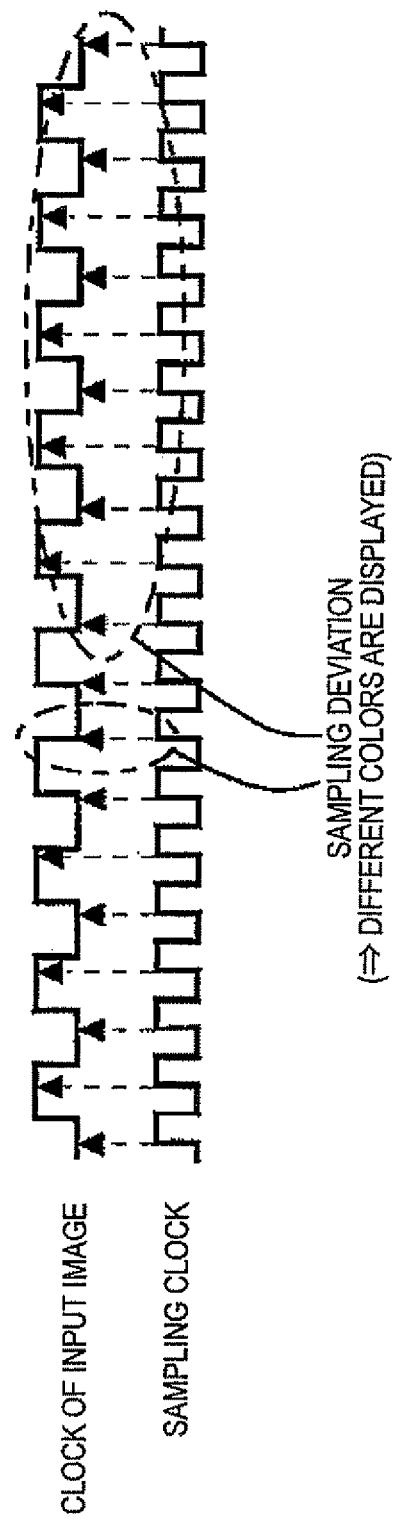
FIG. 9 is a timing chart when clocks do not coincide with each other.

Although in the above-described embodiment, if power is supplied to the image display device 1, clock masking is immediately performed, clock masking may start when a predetermined time has elapsed after power has been supplied. FIGS. 5 and 6 are diagrams showing the circuit configuration of this case. For example, as shown in FIG. 5, until a predetermined time elapses after power has been supplied to the image display device 1, the clock signals are sent directly from the VCO 42 to the divider 33 while bypassing the clock mask 43. After a timer-type switch 44 which operates when a predetermined time has elapsed has been switched, the bypass of the clock mask 43 is released. According to this configuration, the mask processing does not start until a predetermined time elapses, rapidly stabilizing the operation of the display timing circuit section 3. As shown in FIG. 6, until a predetermined time elapses after power has been supplied to the image display device 1, the horizontal synchronization signal which is sent from the timing generator 32 to the clock mask 43 is cut. After the timer-type switch 44 which operates when a predetermined time has elapsed has been turned on, the horizontal synchronization signal output from the timing generator 32 is sent to the clock mask 43. Thus, the mask processing does not start until a predetermined time elapses, rapidly stabilizing the operation of the display timing circuit section 3.

This application is based on Japanese Patent Application No. 2008-250465 filed on Sep. 29, 2008, the content of which is incorporated herein by reference.

REFERENCE SIGNS LIST

1: image display device
2, 102: image output circuit section
3, 103: display timing circuit section
4: oscillation circuit section
5, 105: TFT liquid crystal display
31: phase comparator
32: timing generator
33: divider
41: loop filter
42: VCO
43: clock mask
44: switch
106: oscillation circuit section

The invention claimed is:

1. An oscillation circuit that supplies predetermined oscillation signals to a generating circuit having: a divider which has a fixed division ratio, divides the predetermined oscillation signals with the division ratio and outputs divided signals; a phase comparator which compares a phase difference between a phase of a synchronization signal in image signals and a phase of the divided signals output from the divider; and a generator which generates sampling signals in a cycle based on comparison results from the phase comparator, the oscillation circuit comprising:

a clock signal generating section that generates clock signals in the cycle based on the comparison results from the phase comparator; and
a clock signal mask section which masks a part of the clock signals generated by the clock signal generating section to generate the predetermined oscillation signals and supplies the predetermined oscillation signals to the divider,
wherein the clock signal mask section masks a part of the clock signals such that the cycle of the sampling signals generated by the generator is the same as a predetermined cycle which is the cycle of a clock for use in generating the image signals.

2. The oscillation circuit as set forth in claim 1, wherein the clock signal mask section masks a predetermined number of clocks of the clock signals, and the predetermined number is determined on the basis of the predetermined cycle and the division ratio of the divider.

3. The oscillation circuit as set forth in claim 1,
wherein the generator outputs a synchronization signal synchronized with the sampling signals to the clock signal mask section, and
wherein the clock signal mask section masks a part of the clock signals on the basis of the synchronization signal output from the generator.

4. The oscillation circuit as set forth in claim 3, wherein the clock signal mask section starts to mask the clock signals immediately after the synchronization signal output from the generator is input.

5. The oscillation circuit as set forth in claim 3, wherein the clock signal mask section starts to mask the clock signals when a predetermined time is elapsed after the synchronization signal output from the generator is received.

6. The oscillation circuit as set forth in claim 1, wherein the clock signal mask section starts to mask the clock signals when a predetermined time is elapsed after the generator starts to generate the sampling signals.

7. The oscillation circuit as set forth in claim 6, further comprising a switch configured to supply the clock signals generated by the clock signal generating section directly to the divider while bypassing the clock signal mask section for a predetermined time after the generator starts to generate the sampling signals.

8. The oscillation circuit as set forth in claim 6, further comprising a switch configured to cut the synchronization signal output from the generator for a predetermined time after the generator starts to generate the sampling signals.

9. An image display device that receives image signals to display images, the image display device comprising:
an image display circuit that samples the image signals with sampling signals to display the images;
a generating circuit that generates the sampling signals supplied to the image display circuit; and
an oscillation circuit that supplies predetermined oscillation signals to the generating circuit,
wherein the generating circuit has: a divider which has a fixed division ratio, divides the predetermined oscillation signals with the division ratio and outputs divided signals; a phase comparator which compares a phase difference between a phase of a synchronization signal in the image signals and a phase of the divided signals output from the divider; and a generator which generates the sampling signals in a cycle based on comparison results from the phase comparator,
wherein the oscillation circuit includes a clock signal generating section which generates clock signals in the cycle based on the comparison results from the phase comparator, and a clock signal mask section which masks a part of the clock signals generated by the clock signal generating section to generate the predetermined oscillation signals and supplies the predetermined oscillation signals to the divider, and
wherein the clock signal mask section masks a part of the clock signals such that the cycle of the sampling signals generated by the generator is the same as a predetermined cycle which is the cycle of a clock for use in generating the image signals.

* * * * *